United States Patent [19]
Wu

[11] Patent Number: 5,972,761
[45] Date of Patent: Oct. 26, 1999

[54] METHOD OF MAKING MOS TRANSISTORS WITH A GATE-SIDE AIR-GAP STRUCTURE AND AN EXTENSION ULTRA-SHALLOW S/D JUNCTION

[75] Inventor: Shye-Lin Wu, Hsinchu, Taiwan

[73] Assignee: Texas Instruments - Acer Incorporated, Hsinchu, Taiwan

[21] Appl. No.: 08/998,796

[22] Filed: Dec. 29, 1997

[51] Int. Cl.[6] .................................................. H01L 21/336
[52] U.S. Cl. .......................... 438/305; 438/595; 438/657
[58] Field of Search .................................. 438/305, 306, 438/307, 595, 657

[56] References Cited

U.S. PATENT DOCUMENTS

| | | | |
|---|---|---|---|
| 5,518,960 | 5/1996 | Tsuchimoto | 438/657 |
| 5,585,295 | 12/1996 | Wu | 438/305 |
| 5,641,708 | 6/1997 | Sardella et al. | 438/657 |

OTHER PUBLICATIONS

Shye Lin Wu et al., Suppression of Boron Penetration into an Ultra–Thin Gate Oxide ($\leq$7nm) by Using a Stacked–Amorphous–Silicon (SAS) Film, 1993 IEEE, pp. 329–332.

Kyoji Yamashita et al., Impact of the Reduction of the Gate to Drain Capacitance on Low Voltage Operated CMOS Devices, 1995 Symposium on VLSI Technology Digest of Technical Papers, pp. 69 and 70.

Atsushi Hori et al., High Speed 0.1 $\mu$m Dual Gate CMOS with Low Energy Phosphorus/Boron Implantation and Cobalt Salicide, 1996 IEEE, pp. 575–578.

M. Togo et al., A Gate–Side Air–Gap Structure (GAS) to Reduce the Parasitic Capacitance in MOSETs, 1996 Symposium on VLSI Technology Digest of Technical Papers, pp. 38 and 39.

Bijan Davari, CMOS Technology Scaling 0.1$\mu$m and Beyond, 1996 IEEE, pp. 555–558.

*Primary Examiner*—Chandra Chaudhari
*Attorney, Agent, or Firm*—Harness, Dickey & Pierce, P.L.C.

[57] ABSTRACT

This invention proposes a new process to form MOS transistor with a gate-side air-gap structure and an extension ultra-shallow S/D junction for high speed devices. After growing the thin gate oxide film on silicon substrate, a stacked-amorphous-Si (SAA) film is deposited. A thin CVD oxide film is deposited and then patterned. The top two amorphous-Si layers are etched back and then form the nitride spacers. The pad CVD oxide film is removed by diluted HF solution followed by S/D/G implant. High temperature thermal oxidation process is used to convert the bottom amorphous-Si layers outside the nitride spacers into thermal oxide and simultaneously to form shallow junction. The nitride spacers are removed and then the low energy/high dose ion implantation is performed for extension S/D junction. The bottom amorphous-Si layer is etched back and then RTP anneal in $N_2O$ or NO ambient is used to recover the etching damage to form an extension S/D junction. A thick CVD oxide film is deposited on all regions. Due to the step coverage issue, a air-gap structure would be formed at the gate side.

22 Claims, 4 Drawing Sheets

METHOD OF MAKING MOS TRANSISTORS WITH A GATE-SIDE AIR-GAP STRUCTURE AND AN EXTENSION ULTRA-SHALLOW S/D JUNCTION

BACKGROUND OF THE INVENTION

1. Field of the Invention

The present invention relates to a semiconductor device, especially to a method of fabricating metal oxide semiconductor transistor (MOSFET).

2. Description of the Prior Art

Metal oxide semiconductor field effect transistors (MOSFETs) have been traditionally used and widely applied in the semiconductor technologies. As the trend of the integrated circuits, the fabrication of the MOSFET also meets various issues such as short channel effect and, the generation of parasitic capacitance, etc.

Recent advance in Si ULSI technology creates the need of low power devices operated at low supply voltage. The conventional CMOS device has been designed with thin gate-oxide and short effective channel length and hence this design strategy increases the gate to drain capacitance. Minimizing parasitic capacitance is a key issue for realizing high speed low-power ULSIs as mentioned in the reference "H. Nakamura et al., Symp. on VLSI Tech. Dig.,p.67,1995". This effect has reduced by utilizing a Gate-side Air-gap Structure (GAS) as seen in "M. Togo et al., Symp. on VLSI Tech. Dig.,p.38, 1996". The fringing field capacitance (CFR) becomes more important as the gate length is reduced to deep submicron as seen in "M. Togo et al., Symp. on VLSI Tech. Dig.,p.38, 1996". However, it is difficult to reduce the value of CFR, due to the difficulty of scaling down the dielectric spacer thickness as well as scaling down the device dimension.

To achieve the low voltage operation with small threshold voltage, the surface channel PMOSFET with the P+ poly gate has been investigated in place of the buried channel with the N+poly gate due to the superior short channel behavior as suggested in "B. Davari, in IEDM Tech. Dig., p.575,1996". However, the effect of boron penetration through the thin gate oxide into Si substrate will degrade the device performance. Please see the reference "A. Hori, et al. In IEDM Tech. Dig.,p.575 1996".

SUMMARY OF THE INVENTION

It is an object of the present invention to provide a method of fabricating metal oxide semiconductor transistor (MOSFET) with a gate-side air-gap structure.

This invention proposes a new process to form MOS transistor with a gate-side air-gap structure and an extension ultra-shallow S/D junction for high speed devices. After growing the thin gate oxide film on silicon substrate, a stacked-amorphous-Si (SAS) film is deposited. A thin CVD oxide film is deposited and then patterned. The top two amorphous-Si layers are etched back and then form the nitride spacers. The pad CVD oxide film is removed by diluted HF solution followed by S/D/G implant. High temperature thermal oxidation process is used to convert the bottom amorphous-Si layers outside the nitride spacers into thermal oxide and simultaneously to form shallow junction. The nitride spacers are removed and then the low energy/ high dose ion implantation is performed for extension S/D junction. The bottom amorphous-Si layer is etched back and then RTP anneal in $N_2O$ or NO ambient is used to recover the etching damage to form an extension S/D junction. A thick CVD oxide film is deposited on all regions. Due to the step coverage issue, a air-gap structure would be formed at the gate side. Finally the metal or silicide contact is formed.

DESCRIPTION OF THE PREFERRED EMBODIMENT

The present invention will be described in detail with reference to drawings. The purpose of the present invention is to provide a method for fabricating a metal oxide semiconductor transistor (MOSFET) with a gate-side air-gap structure and an extended S/D junction. The detail processes will be described as follows.

Figure 1:
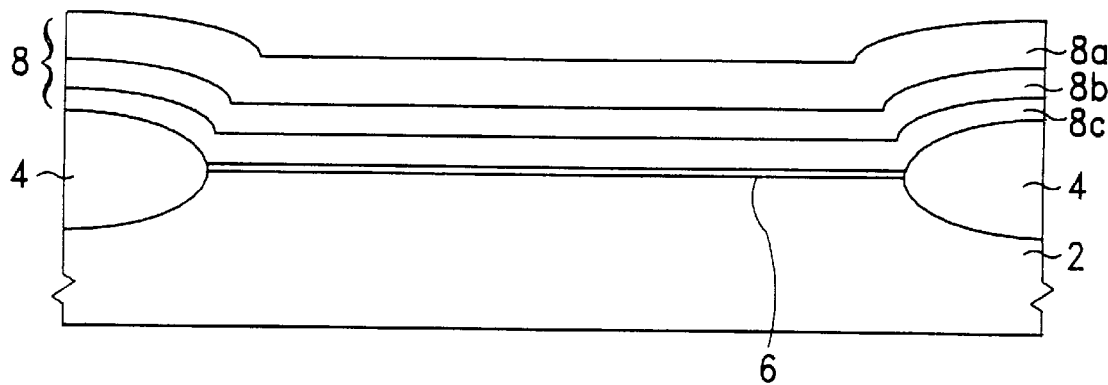
FIG. 1 is a cross section view of the semiconductor wafer illustrating the step of forming a stacked-amorphous (SAS) layer on a thin gate oxide according to the present invention.

Please reference to FIG. 1. In a preferred embodiment, a single crystal silicon substrate 2 with a <100> crystallographic orientation is provided. A plurality of thick field oxide (FOX) regions 4 are formed to provided isolation between devices on the substrate. For example, the FOX regions 4 can be formed via lithography and etching steps to etch silicon nitride-silicon dioxide composition layer. After the photoresist is removed and wet cleaned, thermal oxidation in an oxygen-steam environment is used to grow the FOX region 4 to a thickness about 3000–8000 angstroms. The FOX region 4 can be replaced by a plurality of shallow trench isolations, as well known in the art. Next, a silicon dioxide layer 6 is formed on the top surface of the substrate 2 to serve as a gate oxide layer. Typically, the silicon dioxide layer 6 is formed in an oxygen ambient at a temperature of about 800 to 1100 Centigrade degrees. In this embodiment, the thickness of the silicon dioxide layer is approximately 20 to 200 angstroms. Alternatively, the oxide layer 6 may be formed using any suitable oxide chemical compositions and procedures.

A stacked-amorphous-silicon film 8 is deposited on the FOX regions 4 and the silicon dioxide layer 6 using a low pressure chemical vapor deposition process. In this embodiment, the stacked-amorphous-silicon film 8 is composed of a first amorphous-silicon layer 8c with thickness about 300 to 1500 angstroms, a second amorphous-silicon layer 8b with thickness about 300 to 1500 angstroms, and a third amorphous layer 8a with thickness about 300 to 1500 angstroms, the thickness of the stacked-amorphous-silicon film 8 is totally about 1000 to 4000 angstroms and immediately deposited onto the FOX regions 4 and the silicon dioxide layer 6 at 450–500° C. in three steps. The deposition pressure and deposition rate were controlled at about 140–160 mtorr and 20 angstroms/min, respectively. The aforementioned deposition conditions were suggested in the reference "S. L. Wu, et al., in IEDM. Dig., p329, 1993".

Figure 2:
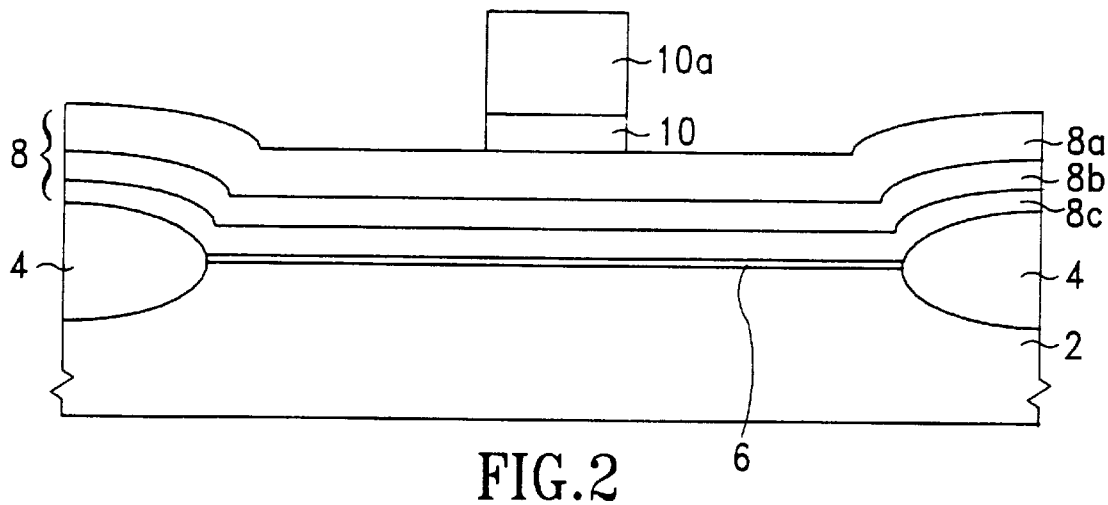
FIG. 2 is a cross section view of the semiconductor wafer illustrating the step of forming a cap TEOS-oxide layer on the stacked-amorphous-silicon (SAS) layer and then defining active area region according to the present invention.

Referring to FIG. 2, a thin oxide film 10 is deposited on the stacked-amorphous film 8. In this preferred embodiment, the thin oxide film 10 is a cap TEOS-oxide film formed by chemical vapor deposition, the thickness of the cap TEOS-oxide film 10 is approximately 300 to 2000 angstroms. After the cap TEOS-oxide film 10 is formed, and then a photoresist layer 10a formed on the cap TEOS-oxide film to define active area by using the photoresist layer 10a as a mask. The residual cap TEOS-oxide film 10 serves as a pad oxide film.

Figure 3A:
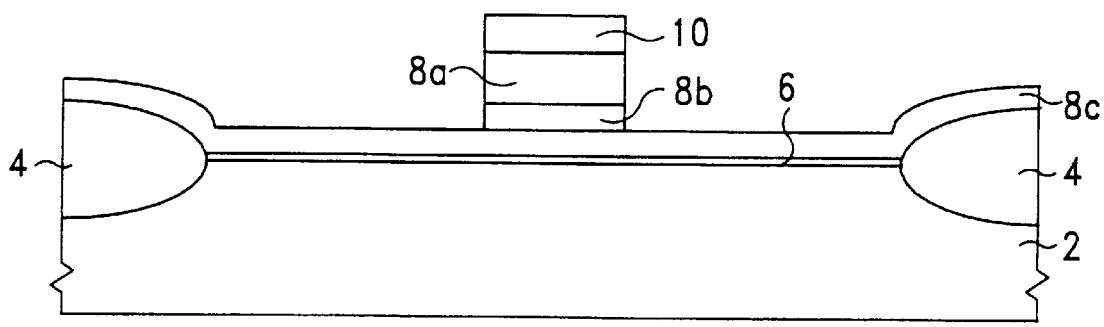
FIG. 3a is a cross section view of a semiconductor wafer illustrating the step of etching the top two amorphous silicon layer according to the present invention.
Figure 3B:
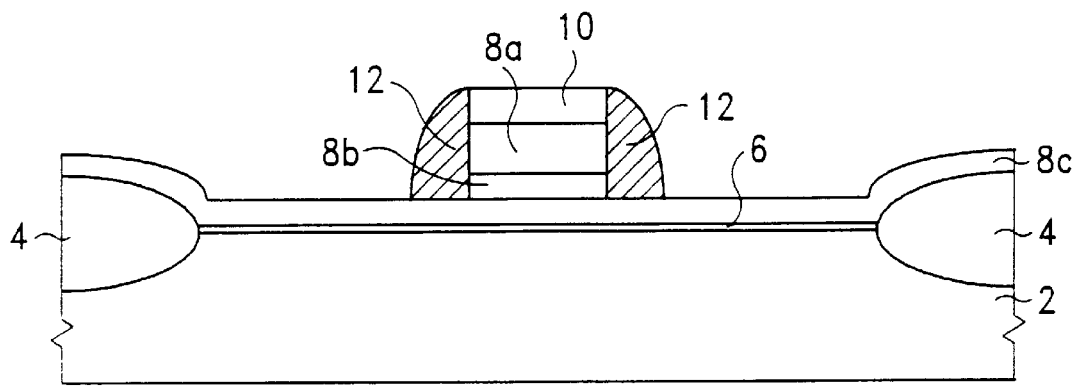
FIG. 3b is a cross section view of a semiconductor wafer illustrating the step of forming a nitride layer over the cap TEOS-oxide layer and on the bottom amorphous silicon layer and then forming nitride spacers according to the present invention.

Turning to FIG. 3a, the top two amorphous-Si layer 8a and 8b (i.e. the second and the third amorphous silicon layer) are etched back using the photoresist layer 10a as a mask, the photoresist layer 10a is removed subsequently. Referring to FIG. 3b, a silicon nitride layer 12 is deposited on the residual cap TEOS-oxide film 10 and on the bottom amorphous-Si layer 8c. Silicon nitride side-wall spacers 12 are formed on the side walls of the residual TEOS-oxide film 10, and the residual top two amorphous-Si 8a and 8b. In order to achieve this an anisotropic etching is used followed by depositing a silicon nitride layer 12 the residual cap TEOS-oxide film 10 and on the bottom amorphous-Si layer 8c.

Figure 4:
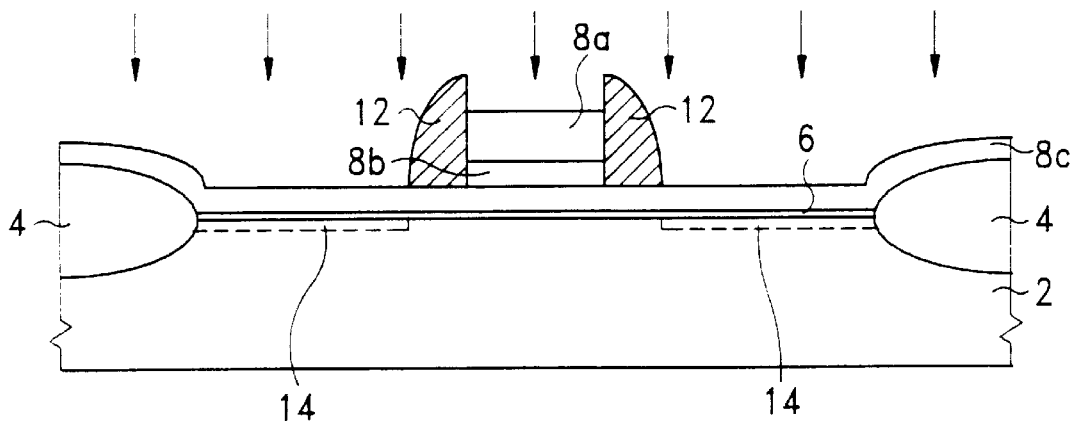
FIG. 4 is a cross section view of a semiconductor wafer illustrating the step of removing the cap TEOS-oxide layer and then performing a S/D/G implantation according to the present invention.

Referring next to FIG. 4, the pad oxide film (residual cap TEOS-oxide film) is removed by diluted HF solution. Using a blanket ion implantation to implant appropriate impurities through the bottom amorphous-Si layer 8c (i.e. the first amorphous silicon layer) and the gate oxide layer 6 into the substrate 2 forms active regions 14 (i.e. the source and drain). The bottom amorphous-Si layer 8c (i.e. the first amorphous silicon layer) act as a buffer to prevent the substrate 2 from damage during the ion implantation. The top amorphous-Si layer 8a is also implanted with ions to increase its conductivity. The dosage and the implantation energy of the step are respectively about $2 \times 10^{15}$ to $2 \times 10^{16}$ ions/cm$^2$, about 10 to 150 KeV.

Figure 5:
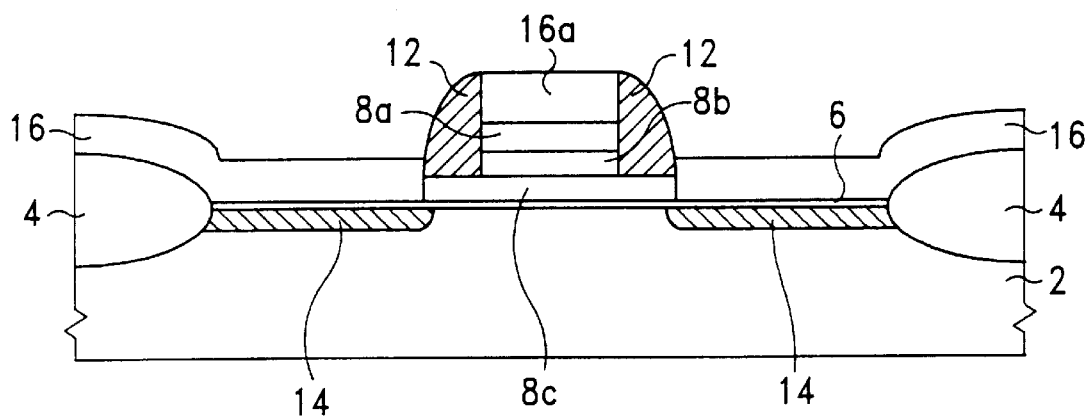
FIG. 5 is a cross section view of a semiconductor wafer illustrating the step of performing a thermal oxidation to convert bottom amorphous silicon layer into oxide and form shallow junction according to the present invention.

Referring next to FIG. 5, a high temperature thermal oxidation is used to convert the bottom amorphous-Si layer 8c outside the nitride spacers 12 into thermal oxide 16 and simultaneously to form shallow S/D junction 14. In this embodiment, the high temperature thermal oxidation is performed at a temperature range of about 800 to 1100 Centigrade degrees for 10–60 minutes. In the same time, another thermal oxide layer 16a is also grown on the top surface of the top amorphous-Si layer 8a.

Figure 6:
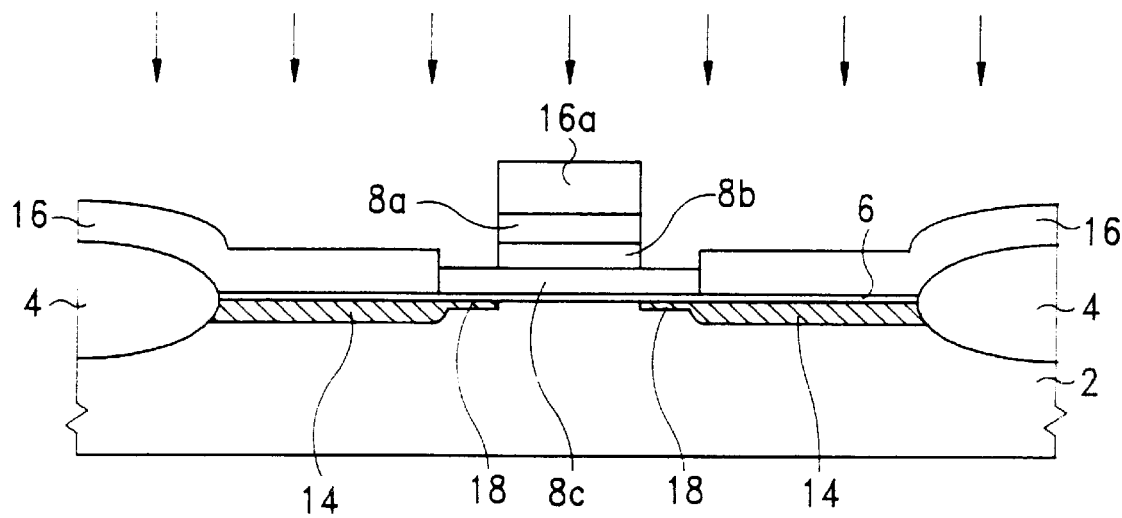
FIG. 6 is a cross section view of a semiconductor wafer illustrating the step of removing the nitride spacers and then performing a low energy extended S/D ion implantation according to the present invention.

Turning to FIG. 6, the nitride spacers 12 are removed, the portion of bottom amorphous-Si layer 8c covered by the spacers 12 are exposed. In a embodiment, the nitride spacers can be removed by hot H$_3$PO$_4$ solution. Then, a low energy and high dosage ion implantation is performed to dope ions via the exposed portion bottom amorphous-Si layer 8c into the substrate 2. Extended source and drain 18 are generated in the substrate 2 and aligned to the regions that the nitride spacer 12 has disposed. The dosage of the implantation is about $5 \times 10^3$ to $2 \times 10^5$ ions/cm$^2$. The implantation energy is about 0.5 to 20 KeV.

Figure 7:
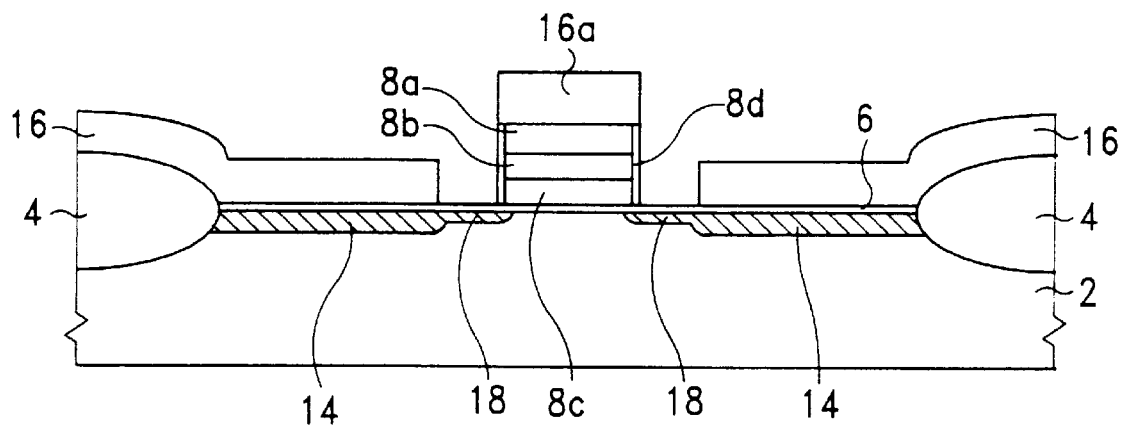
FIG. 7 is a cross section view of a semiconductor wafer illustrating the step of etching back the bottom amorphous silicon and then performing a rapid thermal process in $N_2O$ ambient to recover the etching damage and to form an extended S/D junction according to the present invention.

Referring to FIG. 7, the bottom amorphous-Si layer 8c is etched back, and then a rapid thermal process (RTP) is carried out for annealing in N$_2$O or NO ambient to recover the etching damage and to form extended source and drain junction 18. In this preferred embodiment, the rapid thermal annealing is performed at the temperature range of approximately 800 to 1100 Centigrade degrees for about 30–120 seconds. Further, all the three stacked-amorphous silicon 8a, 8b, and 8c layer are changed to polycrystalline phase and serve as the gate 8d of a MOSFET device.

Figure 8:
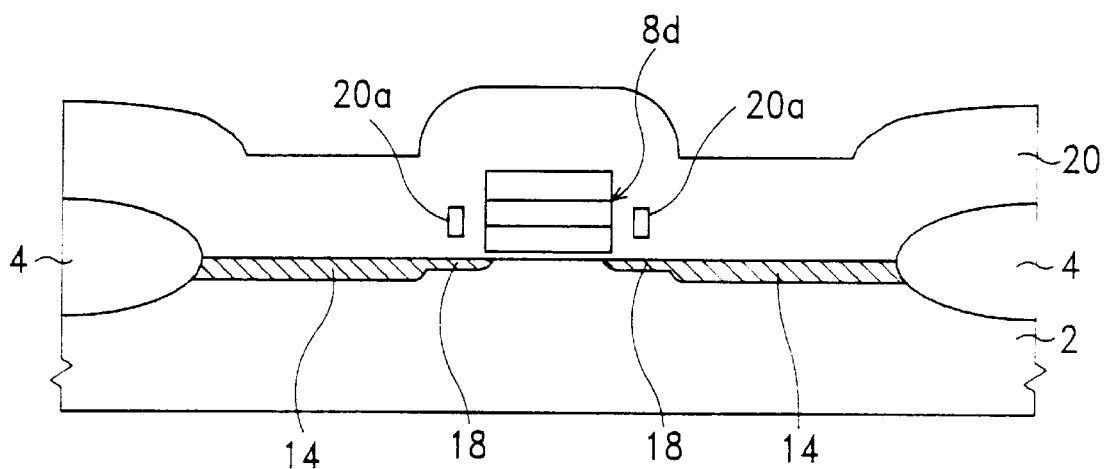
FIG. 8 is a cross section view of a semiconductor wafer illustrating the step of forming thick CVD oxide film on all region according to the present invention.

A thick oxide film 20 is deposited over all region by chemical vapor deposition. In this embodiment, the thick oxide film can be a silicon dioxide film, a TEOS film, a BPSG film, or a PSG film. The thickness of the thick oxide film is about 1000 to 10000 angstroms. Due to the step coverage issue, an air-gap structure will be formed at the gate side, as suggested in "M. Togo et al., Symp. on VLSI Tech. Dig., p38, 1996". As shown in FIG. 8, the air-gaps 20a are formed at the both gate side and separated by the gate 8d.

Figure 9:
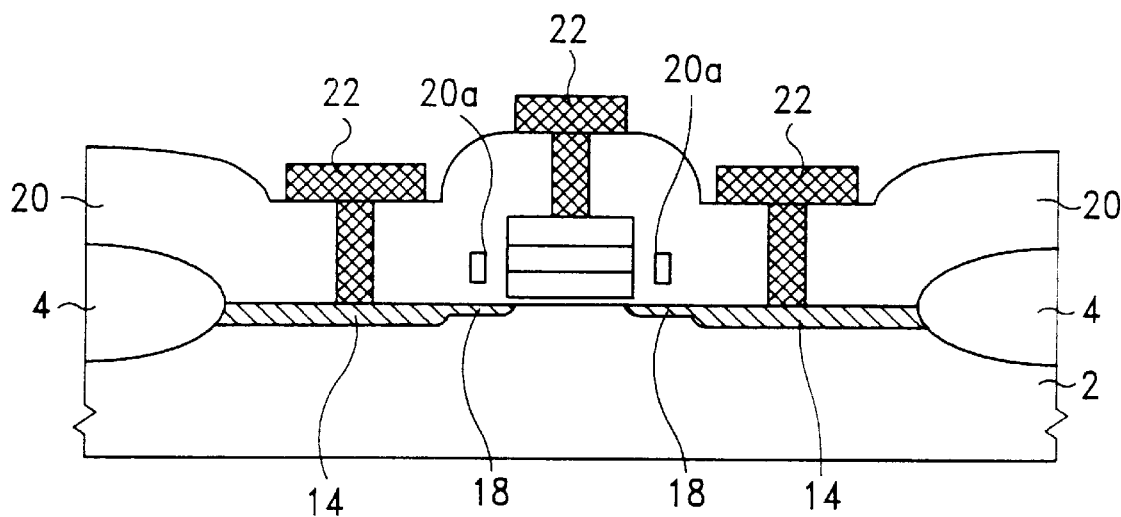
FIG. 9 is a cross section view of a semiconductor wafer illustrating the step of forming metal and silicide contact according to the present invention.

Next reference to FIG. 9, the metal contacts 22 of source, drain 14 and gate 8d are formed by using standard contact hole process and metal plug process.

Due to the method that we proposed above, the benefits of this invention are (1) the device operation speed could be increased by reducing the fringing field capacitance; and (2) the boron penetration effect could be minimized by using the stacked-amorphous-Si layers as the gate material.

As is understood by a person skilled in the art, the foregoing preferred embodiment of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a transistor with a gate-side air-gap structure and an extended source and drain junction in a semiconductor substrate, said method comprising the steps of:

forming a gate oxide layer on said substrate;

forming a first amorphous silicon layer on said gate oxide layer;

forming a second amorphous silicon layer on said first amorphous silicon layer;

forming a third amorphous silicon layer on said second amorphous silicon layer, wherein said first, second, and third amorphous silicon layer act as a stacked-amorphous silicon layer;

forming a first oxide layer on said stacked-amorphous silicon layer act as a pad oxide layer;

forming a photoresist layer on said pad oxide layer;

pattering said pad oxide layer to define active area region by using said photoresist layer as a mask etching said second amorphous silicon layer, and said first amorphous silicon layer using said photoresist layer and said patterned pad oxide layer as mask;

removing said photoresist layer;

forming a dielectric layer over said patterned pad oxide layer, said first amorphous silicon layer;

etching said dielectric layer to form side-wall spacers;

removing said patterned pad oxide layer;

performing first ion implantation to dope ions through said first amorphous silicon layer and said gate oxide layer into said substrate, thereby forming first doped ion regions to serve as source and drain of said transistor;

performing a thermal oxidation to convert said first amorphous silicon layer into oxide layer, a second oxide layer being grown on the top of said third amorphous silicon layer, wherein said portions of said first amorphous silicon covered by said spacers and said second amorphous silicon layer, said second amorphous silicon and said third amorphous silicon layer being covert into polycrystalline phase silicon together act as gate structure of said transistor, and drive said ions into said substrate to form shallow source and drain junction;

removing said dielectric side-wall spacers to expose portion of said first polysilicon layer being converted from said first amorphous silicon layer;

performing second ion implantation through said exposed portion of said first polysilicon to form second doped ion regions next to said first doped ion regions;

etching said exposed portion of said first polysilicon layer by using said gate oxide layer as a etching stop layer;

performing a rapid thermal annealing to recover etching damage and to form an extension source and drain junction next to said source and drain junction; and forming a third oxide layer over said gate structure and said substrate thereby forming air gaps in said gate sides and being separated by said gate structure.

2. The method of claim 1, wherein said dielectric layer comprises silicon nitride.

3. The method of claim 1, wherein said dielectric side-wall spacers being removed by hot phosphorus solution.

4. The method of claim 1, wherein said thermal oxidation is performed at a temperature about 700 to 1100 centigrade.

5. The method of claim 1, wherein said rapid thermal annealing is performed at a temperature about 800 to 1100 centigrade.

6. The method of claim 1, wherein said first amorphous silicon have a thickness about 300 to 1500 angstroms.

7. The method of claim 1, wherein said second amorphous silicon have a thickness about 300 to 1500 angstroms.

8. The method of claim 1, wherein said third amorphous silicon have a thickness about 300 to 1500 angstroms.

9. The method of claim 1, wherein said first ion implantation have implantation dosage about $2\times10^{15}$ to $2\times10^{16}$ ions/cm$^2$, and implantation energy about 20 to 150 KeV.

10. The method of claim 1, wherein said second ion implantation have implantation dosage about $5\times10^{13}$ to $2\times10^{15}$ ions/cm$^2$, and implantation energy about 0.5 to 20 KeV.

11. The method of claim 1, wherein said rapid thermal annealing is performed at a temperature about 800 to 1100 centigrade for 30–120 seconds.

12. The method of claim 5, wherein said rapid thermal annealing is performed in NO ambient.

13. The method of claim 5, wherein said rapid thermal annealing is performed in $N_2O$ ambient.

14. The method of claim 1, wherein said first oxide layer is a TEOS-oxide layer with thickness about 300 to 2000 angstroms.

15. The method of claim 1, wherein said third oxide layer is a BPSG layer with thickness about 1000 to 10000 angstroms.

16. The method of claim 1, wherein said third oxide layer is a TEOS-oxide layer with thickness about 1000 to 10000 angstroms.

17. The method of claim 1, wherein said first amorphous layer is formed by low pressure chemical vapor deposition with thickness about 300 to 1500 angstroms.

18. The method of claim 17, the deposition pressure is controlled at 140 to 160 mtorr, the deposition rate is controlled approximately 20 angstroms/minute.

19. The method of claim 1, wherein said second amorphous layer is formed by low pressure chemical vapor deposition with thickness about 300 to 1500 angstroms.

20. The method of claim 19, the deposition pressure is controlled at 140 to 160 mtorr, the deposition rate is controlled approximately 20 angstroms/minute.

21. The method of claim 1, wherein said first amorphous layer is formed by low pressure chemical vapor deposition with thickness about 300 to 1500 angstroms.

22. The method of claim 21, the deposition pressure is controlled at 140 to 160 mtorr, the deposition rate is controlled approximately 20 angstroms/minute.

* * * * *